(12) United States Patent
Alaas et al.

(10) Patent No.: US 9,935,453 B2
(45) Date of Patent: *Apr. 3, 2018

(54) GROUND FAULT IMMUNE SENSOR POWER SUPPLY FOR DOWNHOLE SENSORS

(71) Applicant: Halliburton Energy Services, Inc., Houston, TX (US)

(72) Inventors: Yusef Alaas, Houston, TX (US); Sudhir Kumar Gupta, Kingwood, TX (US); Aram Shihab Khaleel Almuhana, Houston, TX (US)

(73) Assignee: Halliburton Energy Services, Inc., Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/107,395

(22) PCT Filed: Jul. 17, 2015

(86) PCT No.: PCT/US2015/041016
§ 371 (c)(1),
(2) Date: Jun. 22, 2016

(87) PCT Pub. No.: WO2017/014734
PCT Pub. Date: Jan. 26, 2017

(65) Prior Publication Data
US 2017/0194784 A1    Jul. 6, 2017

(51) Int. Cl.
*H02H 3/00* (2006.01)
*H02H 3/16* (2006.01)
(Continued)

(52) U.S. Cl.
CPC .............. *H02H 3/165* (2013.01); *E21B 47/12* (2013.01); *G01R 31/025* (2013.01);
(Continued)

(58) Field of Classification Search
CPC ...... H02H 3/165; G01R 31/025; E21B 47/12; H02P 29/028; H02P 29/0243
(Continued)

(56) References Cited

U.S. PATENT DOCUMENTS 4,798,247 A    1/1989    Deaton et al.
5,515,038 A    5/1996    Smith
(Continued)

FOREIGN PATENT DOCUMENTS

WO    WO 2013/132233 A1    9/2013
WO    WO 2013/132234 A1    9/2013
(Continued)

OTHER PUBLICATIONS

Search Report issued for NL Patent Application No. 1041881, dated Mar. 2, 2017, 10 pages.
(Continued)

*Primary Examiner* — Ronald W Leja
(74) *Attorney, Agent, or Firm* — Haynes and Boone, LLP

(57) ABSTRACT

A ground fault immune power and data delivery system for downhole sensors is connected to a downhole motor via a three-phase power cable. An AC power supply and sensor data module are electrically connected to one of two conductors (phases) at a time selected from the three conductors (phases) to provide power and data signals to the downhole sensors. If a ground fault is detected on one of the two connected phases, an isolation module isolates the grounded phase and switches to the ungrounded connected phase to continue transmitting power and data signals. A frequency of AC power supply, data communication frequencies and a switching frequency of a drive controlling the downhole motor are orthogonal to each other in order to mitigate interference. Surface-to-downhole communication can occur by adjusting voltage, frequency and/or phase of AC power supply controlled by a processor.

32 Claims, 4 Drawing Sheets

(51) Int. Cl.
*G01R 31/02* (2006.01)
*E21B 47/12* (2012.01)
*H02M 1/084* (2006.01)
*H02P 29/028* (2016.01)
*H02P 29/024* (2016.01)
*H04B 3/54* (2006.01)

(52) U.S. Cl.
CPC .......... *H02M 1/084* (2013.01); *H02P 29/028* (2013.01); *H02P 29/0243* (2016.02); *H04B 3/54* (2013.01); *H04B 2203/5475* (2013.01)

(58) Field of Classification Search
USPC .......................................................... 361/47
See application file for complete search history.

(56) References Cited

U.S. PATENT DOCUMENTS

| | | |
|---|---|---|
| 6,798,338 B1 | 9/2004 | Layton |
| 8,138,622 B2 | 3/2012 | Layton et al. |
| 8,344,904 B2 | 1/2013 | Skinner et al. |
| 2006/0102341 A1 | 5/2006 | Freer et al. |
| 2006/0213659 A1 | 9/2006 | McCoy |
| 2008/0272932 A1* | 11/2008 | Booker ............... H04B 3/54 340/854.9 |
| 2013/0210250 A1* | 8/2013 | Takemura ............ H04B 3/54 439/170 |
| 2015/0109139 A1* | 4/2015 | Shanks ................ H04B 3/54 340/854.9 |

FOREIGN PATENT DOCUMENTS

| | | |
|---|---|---|
| WO | WO 2015/015304 A2 | 2/2015 |
| WO | WO 2015/167464 A1 | 11/2015 |
| WO | WO 2016/175759 A1 | 11/2016 |

OTHER PUBLICATIONS

International Search Report and The Written Opinion of the International Search Authority, or the Declaration, dated Mar. 29, 2016, PCT/US2015/041016, 9 pages, ISA/KR.

* cited by examiner

GROUND FAULT IMMUNE SENSOR POWER SUPPLY FOR DOWNHOLE SENSORS

PRIORITY

The present application is a U.S. National Stage patent application of International Patent Application No. PCT/US2015/041016, filed on Jul. 17, 2015, the benefit of which is claimed and the disclosure of which is incorporated herein by reference in its entirety.

TECHNICAL FIELD

The present disclosure relates generally to downhole power systems and, more specifically, to a ground fault immune power and data delivery system for downhole sensors.

BACKGROUND

Artificial lift systems, such as Electrical Submersible Pump (ESP) systems, are often used in hydrocarbon producing wells to pump fluids from the well up to the surface. A conventional ESP system typically includes a centrifugal pump that is driven by a three-phase voltage supply and a variable speed drive, both located at the surface, that deliver the three-phase power to the downhole motor via a three-phase power cable. In addition, data signals between the surface and downhole sensors are also transmitted over the power cable. Such signals include various data related to performance of downhole components and downhole measurements.

An issue arises, however, when one or more of the phases are grounded along the power cable. When this occurs, data transmission is not reliable or not possible over the power cable depending on the location at which the cable is grounded.

Accordingly, there is a need in the art for a ground fault immune power and data delivery system for use in a downhole environment.

BRIEF DESCRIPTION OF THE DRAWINGS

Various embodiments of the present disclosure will be understood more fully from the detailed description given below and from the accompanying drawings of various embodiments of the disclosure. In the drawings, like reference numbers may indicate identical or functionally similar elements

DETAILED DESCRIPTION

Figure 1:
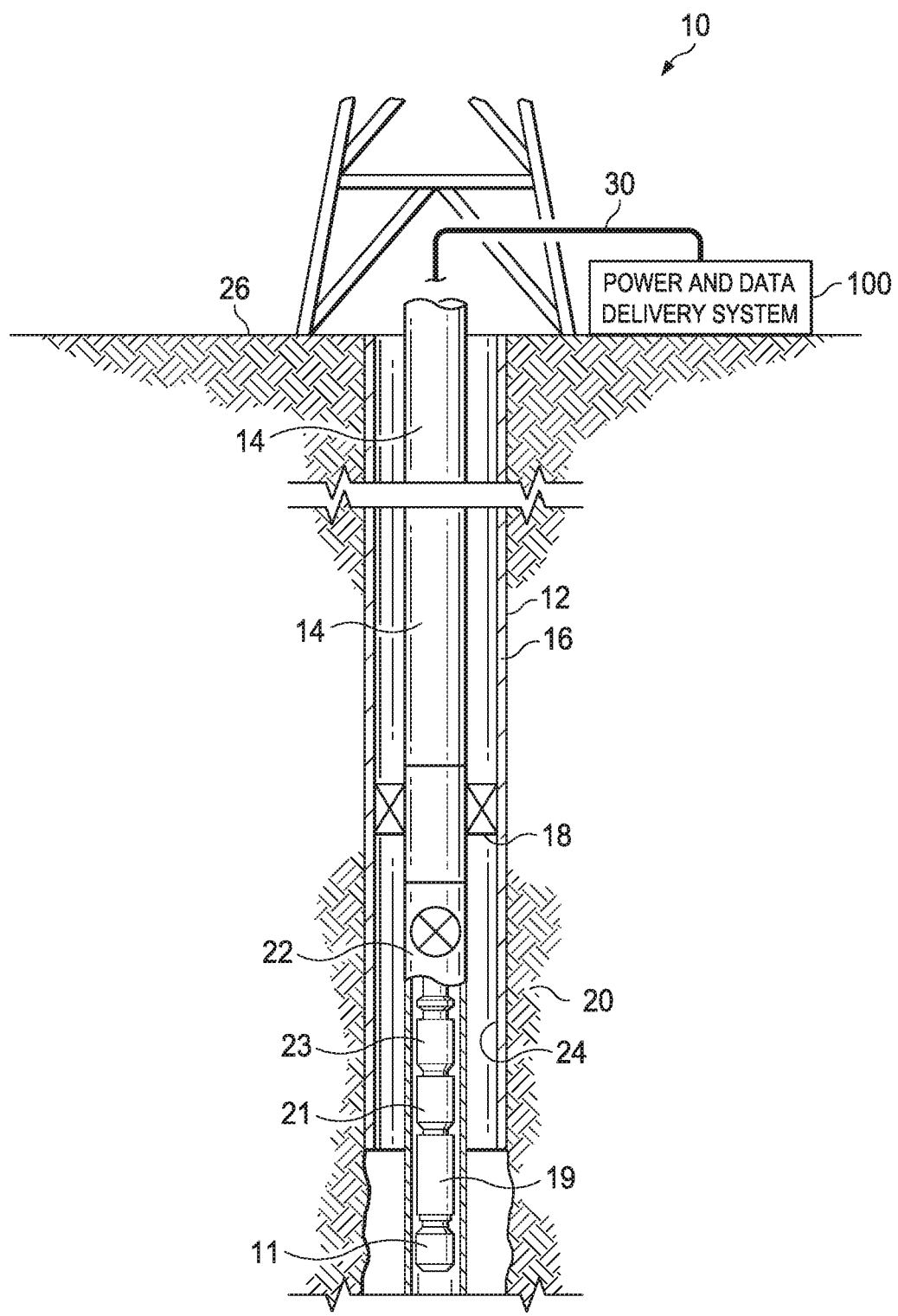
FIG. 1 is a schematic illustration of a well system utilizing a ground fault immune power and data delivery system, according to certain illustrative embodiments of the present disclosure.

Illustrative embodiments and related methods of the present disclosure are described below as they might be employed in a ground fault immune power and data delivery system for downhole sensors. Embodiments of the present disclosure are related to developing power supply for down hole sensors of oil wells, with electric submersible pumps, which is operational even when one of the phases of submersible motor is grounded and which does not interfere with data communication and with a switching frequency of a drive coupled to the submersible motor. In the interest of clarity, not all features of an actual implementation or method are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of the disclosure will become apparent from consideration of the following description and drawings.

As described herein, illustrative embodiments of the present disclosure provide a ground fault immune power and data delivery system for downhole sensors. In a generalized embodiment, a three-phase power supply at a surface provides three-phase power to a downhole motor (e.g., ESP motor) via a three-conductor cable. A downhole sensor module is connected to the downhole motor via a Wye point connection. An alternating current (AC) power supply at the surface is electrically connected to one of two conductors (phases) at a time selected from the three conductors (phases) to thereby supply AC power signals to the downhole sensor module. A sensor data module at the surface is also electrically connected to the same one conductor (phase) at a time of the two conductors (phases) to communicate data signals to and from the downhole sensor module. Isolation modules are connected between the AC power supply and sensor data module and the two conductors to selectively isolate one of the two conductors in response to a ground fault occurring along the isolated conductor. Thus, the AC power supply and sensor data module are both connected to one conductor (phase) at a time. The switch from that conductor to another conductor (phase) of the two conductors connected to the isolation modules happens when the ground fault is detected on the connected conductor (phase).

During normal operation of this generalized embodiment, downhole sensor power and data signals are transmitted over only one of the two connected conductors. Therefore, if a ground fault is detected on the third unconnected conductor, power and data signals continue to be transmitted over the single conductor that is connected to the power and data delivery system. When a ground fault is detected on one of the two connected conductors, the isolation module isolates the grounded connected conductor and switches to the ungrounded conductor if necessary. As a result, power and data signals continue to be communicated over the only remaining connected conductor.

Certain illustrative embodiments described herein provide no more circuitry than necessary to maintain ground fault immunity and robust data communication. Since most downhole motors shut down when two of the three conductors are grounded, there is no need for the power and data system of the present disclosure to be connected to more than two conductors. However, many prior art systems do connect to all three conductors, thereby adding unnecessarily complicated and costly circuitry to their designs. Embodiments of the present disclosure, however, take advantage of this shut down feature in that only two of the three conductors are connected to the power and data delivery system. Upon the occurrence of a ground fault on any one of the three conductors, the power and data delivery system continues to communicate over one of the two connected conductors. If a ground fault occurs on two of the three conductors, the power and data delivery system will still allow the transmission of power and data signals (assuming the ungrounded conductor is a connected conductor) even though the motor has shut down, which is especially useful during temporary motor shut-down conditions. The system is designed to work continuously with any of the three conductors (phases) grounded. In one or more embodiments, with two or more grounded conductors (phases), the system may still work depending on the severity and location of the ground fault. Accordingly, efficient and robust ground fault immunity and data communication is provided at less cost.

FIG. 1 is a schematic illustration of a well system utilizing a ground fault immune power and data delivery system, according to certain illustrative embodiments of the present disclosure. Well system 10 includes a wellbore 12 extending through various earth strata, including a production zone 20. Wellbore 12 has installed therein casing 16 and a tool string 14, which, in this example, is a production string. A packer assembly 18 is shown positioned above a standing valve assembly 22, sealing annulus 24 formed between production string 14 and wellbore casing 16 and isolating the production interval. A downhole motor 19 (e.g., a downhole submersible pump, such as an ESP or other artificial lift system) is positioned downhole from standing valve assembly 22 for pumping production fluid from the formation to surface 26. Downhole motor 19 is coupled through a seal 21 to a pump 23. As understood in the art, standing valve assembly 22 prevents fluid back-flow into downhole motor 19 when pump 23 is shut off for maintenance, injection procedures, pressure tests, etc.

A ground fault immune power and data delivery system 100 is positioned at surface 26. As will be described in more detail below, power and data delivery system 100 supplies three-phase power to downhole motor 19 via three-phase power cable 30, which is a three conductor cable. Power and data delivery system 100 also supplies AC power via power cable 30 to a downhole sensor module 11 that is connected to downhole motor 19. In addition, power and data delivery system 100 also enables bi-directional data communication between a sensor data module (not shown) and downhole sensor module 11 via power cable 30.

Although described herein for use in a downhole ESP sensor application, various embodiments of the present disclosure may be utilized in any downhole system that utilizes three-conductor power line carrier communication, such as, for example, some wireline applications, logging-while-drilling (LWD) applications, measurement-while-drilling (MWD) applications, slickline applications, etc., as will be understood by those ordinarily skilled in the art having the benefit of this disclosure. Moreover, while shown in FIG. 1 in a cased, vertical wellbore, illustrative embodiments of the present disclosure will work in any orientation, and in open or cased hole. It is understood that embodiments of the disclosure can be used in various methods, including production, work-over, completion, testing, drilling, fracturing, remedial procedures, etc.

Figure 2:
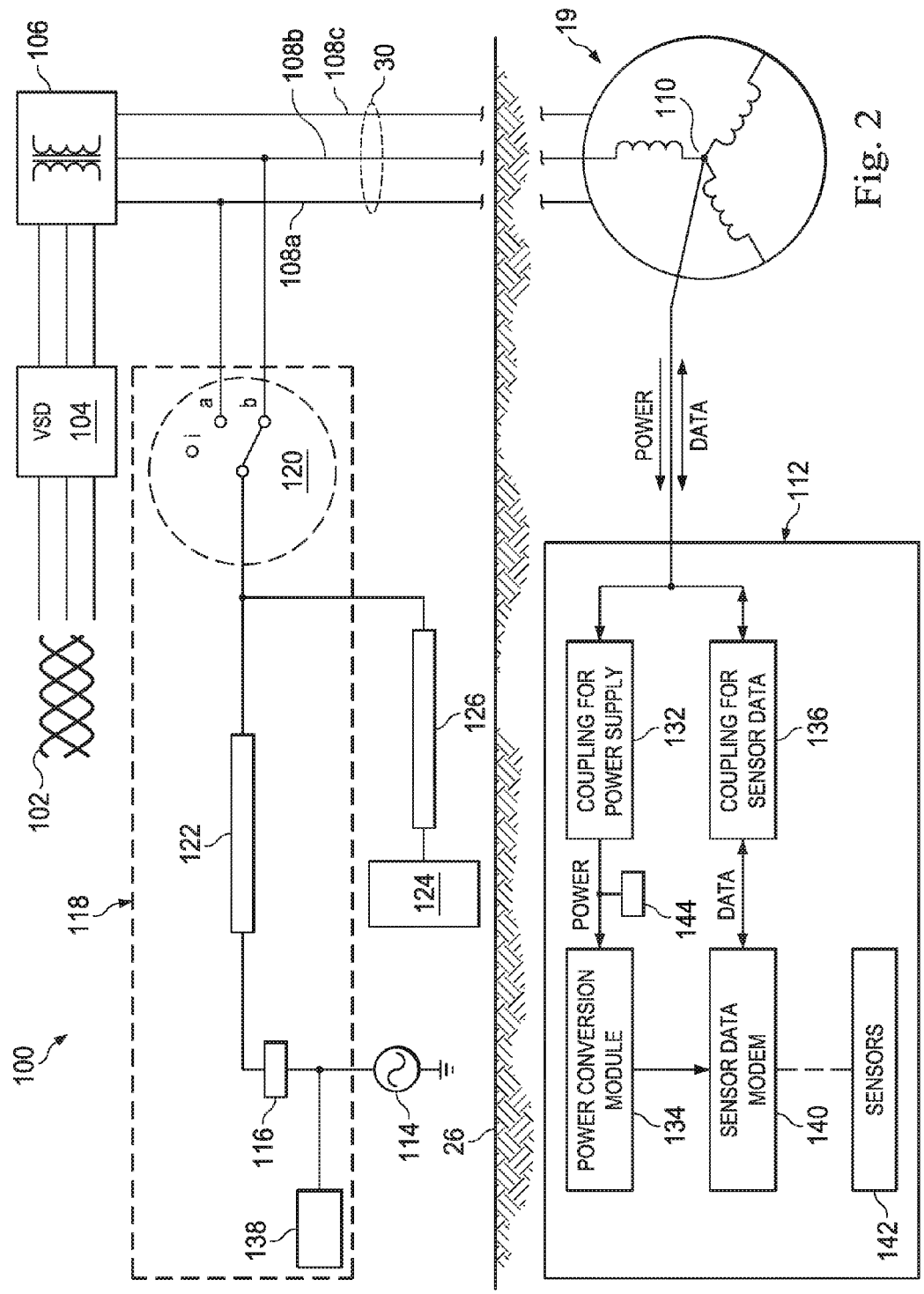
FIG. 2 is simplified block diagrammatical illustration that shows the operation and features of illustrative embodiment of a ground fault immune power and data delivery system.

FIG. 2 is a simplified block diagrammatical illustration that shows the operation and features of an illustrative embodiment of ground fault immune power and data delivery system 100. As previously stated, power and data delivery system 100 provides power and data communication downhole via power cable 30. Power and data delivery system 100 includes a three-phase voltage input 102 (e.g., root-mean-square voltage of 480 V with frequency of 60 Hz) which feeds a variable speed drive (VSD) 104 that controls the speed of downhole motor 19 using a controller (not shown). For example, the output of variable speed drive 104 may be a three-phase voltage output of 480V (root-mean square) having a variable frequency generated by a switching circuitry (not shown) of variable speed drive 104, wherein the variable switching frequency controls the speed of downhole motor 19. An optional step-up transformer 106 can be connected between variable speed drive 104 and power cable 30 to increase the voltage level of three-phase voltage output supplying downhole motor 19 via power cable 30. Power cable 30 may extend thousands of feet into the wellbore where it is ultimately connected to downhole motor 19. By altering the output voltage and switching frequency of variable speed drive 104, the controller associated therewith controls the speed of downhole motor 19.

Power cable 30 includes a first conductor 108a, second conductor 108b and third conductor 108c which jointly provide the three phases of power to downhole motor 19. Downhole motor 19 is connected to conductors 108a,b,c via a Wye point connection 110. A downhole sensor module 112 is connected to Wye point 110 whereby power and data signals are communicated over power cable 30 as will be described below. Sensor module 112 may utilize a variety of sensors, including, for example, resistivity, magnetic or electrical sensors.

At surface 26, power and data delivery system 100 further includes a variable (voltage, frequency and phase) AC power supply 114 to provide AC power signals to downhole sensor module 112. AC power supply 114 has high frequency AC power output. In this illustrative embodiment, AC power supply 114 is only connected to first conductor 108a and second conductor 108b to thereby supply the AC power signals. In general, AC power from AC power supply 114 is transmitted on one of the three conductors 108a,b,c feeding AC power to downhole submersible motor 19. A first isolation module 118 is connected to AC power supply 114 to selectively isolate the first or second conductor 108a,b in response to a ground fault occurring along the isolated conductor 108a or 108b. As a result, the AC power signals continue to be supplied over the single connected conductor 108a or 108b. In one or more embodiments, power coupling is implemented downhole in order to filter out low frequency motor power, when one of the motor phases is grounded.

First isolation module 118 includes a current sensor 116, a high voltage switch 120 and processing circuitry 138 coupled thereto to effect switching of switch 140 between first and second conductor 108a and 108b. Current sensor 116 is connected in series to AC power supply 114 to thereby detect the current being supplied from AC power supply 114. The detected current level is an indicator of whether there is a ground in one of the conductors 108a,b. Processing circuitry 138 (e.g., a microprocessor with a non-volatile memory) is coupled to current sensor 116 and high voltage switch 120 to control the isolation. Processing circuitry 138 may be some standalone circuitry or may the same controller be used to control variable speed drive 104 and other system components. A first tuned impedance coupling 122 is connected between current sensor 116 and high voltage switch 120 to filter unwanted signals. A second tuned impedance coupling 126 is positioned between sensor data module 124 and high voltage switch 120 to also filter unwanted signals. High voltage switch 120 may be, for example, a high voltage relay or contactor.

It should also be noted that processing circuitry 138 may include at least one processor, or analog circuit which triggers based on a current threshold, and a non-transitory and computer-readable storage, all interconnected via a system bus. Software instructions executable by the processor for implementing the illustrative power and data communication methods described herein in may be stored in local storage or some other computer-readable medium. It will also be recognized that the same software instructions may also be loaded into the storage from a CD-ROM or other appropriate storage media via wired or wireless methods.

Moreover, those ordinarily skilled in the art will appreciate that various aspects of the disclosure may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof in a computer system or other processing system.

Referring back to FIG. 2, to control the isolation technique during operation, first isolation module 118 detects a ground fault along first conductor 108a or second conductor 108b. Such fault detection may be accomplished in a variety of ways. In a first illustrative embodiment, processing circuitry 138 determines the current at switch 120 in position (a) (i.e., connected to conductor 108a) and at switch 120 in position (b) (i.e., connected to conductor 108b) by reading the current levels detected by sensor 116 and then comparing the readings. For example, the readings of current levels at switch 120 in positions (a) and (b) may be accomplished by positioning switch 120 in position (a) at a time A, detecting the current, and then storing the reading. At time B, switch 120 is placed in position (b), the current is detected, and the reading is then stored. Processing circuitry 138 thereafter compares the two currents to determine in which position switch 120 needs to be placed. When one of first or second conductors 108a,b are grounded, the current on the grounded conductor increases. As processing circuitry 138 continuously monitors the current at the first and second conductors 108a,b, the resulting higher current reading prompts processing circuitry 138 to place the switch 120 in a certain preferred position. Once switch 120 is in position (a) or in position (b), the switch 120 maintains the supply of the AC power signal to downhole sensor module 112 via the connected conductor 108a or 108b. In FIG. 2, switch 120 is in position (b) and hence second conductor 108b is the connected conductor, while first conductor 108a is the isolated conductor.

In an alternative method to detect a ground fault, processing circuitry 138 may monitor the currents at switch 120 in positions (a) and (b) continuously and compare the current readings to a preset threshold current value. In certain illustrative embodiments, the threshold value could be pre-computed by processing circuitry 138 based on voltage of AC power supply 114 and the impedance of the overall circuit connected thereto. Once either current is determined to exceed the preset value, the switch 120 is placed in an appropriate (preferred) position.

Still referring to FIG. 2, ground fault immune power and data delivery system 100 further includes a tuned impedance coupling 122 connected between AC power supply 114 and switch 120. As will be understood by those ordinarily skilled in the at having the benefit of this disclosure, the tuned impedance coupling 122 allows the frequencies of AC power supply 114 to pass onto to first and second conductors 108a,b, while presenting high impedance to other frequencies, thereby preventing low frequency motor voltages supplied by VSD 104 and transformer 106 from entering data/sensor power supply circuitry. Such coupling may be designed in a variety of ways including, for example, a capacitor in series with an inductor or other necessary design.

Ground fault immune power and data delivery system 100 further includes a sensor data module 124 which controls data communications (one-way and bi-directional communication) with downhole sensor module 112 via first and second conductors 108a,b. Among other functions, sensor data module 124 primarily demodulates data signals received from downhole sensor circuitry. In the event of a ground fault on one of the first and second conductors 108a,b, switch 120 may be placed in an appropriate (preferred) position as described above and data signals may be communicated through one of conductors 108a or 108b.

A tune impedance coupling 126 is connected between sensor data module 124 and switch 120. Tuned impedance coupling 126 is designed to allow the frequencies of data signals sent by sensor data module 124 and downhole sensor module 112 to pass therethrough, while presenting high impedance to other frequencies to prevent failure of data circuitry from high voltages from VSD 104 and transformer 106. It also provides high impedance to the sensor power supply frequency, thus reducing attenuation of the power supply signal. Such coupling may be designed in a variety of ways as previously described.

With reference to FIG. 2, operation of ground fault immune power and data delivery system 100 will now be described. During normal operation, AC power and data signals are transmitted on only one of the conductors 108a or 108b. In certain embodiments during normal operation, processing circuitry 138 initially may randomly choose to isolate the first conductor 108a or 108b, while in other embodiments the conductor having the lowest current is selected. Nevertheless, as a result, only one phase is connected to AC power supply 114 and sensor data module 124 during normal operation. If a ground fault is present on third conductor 108c, the AC power and data signals continued to transmit over the connected conductor 108a,b. If a ground fault is detected on the first or second conductor 108a,b, however, the current on the grounded detector will spike. Processing circuitry 138 detects the current spike at switch 120 in position (a) or the current spike at switch 120 in position (b), and isolates the grounded conductor 108a or 108b accordingly using one of the detection techniques described above.

During a grounded fault state, some attenuation is still seen on the power and data signals. This is because, even with a ground on 108c, for example, there is a path from 108a or 108b to the ground on 108c thru either transformer 106 or motor 19. Thus, in certain illustrative embodiments, the frequencies of power and data signals are chosen in such a way that the impedance of transformer 106 and motor 19 is higher as to these frequencies.

During the grounded fault state, the conductor 108a or 108b that remains connected to AC power supply 114 and sensor data module 124 continues to communicate AC power and data signals along the connected conductor 108a or 108b. In the example shown in FIG. 2, first conductor 108a is the grounded conductor. As a result, processing circuitry 138 has isolated first conductor 108a by placing switch 120 in position (b) to enable communication along second conductor 108b. As such, AC power and data signals are allowed to travel along second conductor 108b, through Wye coupling 110 and on to downhole sensor module 112. Here, the AC power encounters a power coupling 132 which filters out low frequency power from downhole motor 19 caused by the grounding of second conductor 108b. The AC power continues onto to a power conversion module 134 supplying a sensor data modem 140 as well as sensors and measurement transducers 142 with AC power.

Power conversion module 134 converts the AC power to the required voltage levels for the downhole processing circuitry (e.g., processing circuitry of sensor data modem 140). Sensors and measurement transducers 142 house transducers to measure well characteristics, such as an intake pressure, discharge pressure and temperature. Sensors and measurement transducers 142 also house transducers to measure characteristics of downhole motor 19, such as winding temperature and accelerations in horizontal and vertical directions. Data signals (e.g., sensor measurement data) are transmitted from sensors 142 and sensor data modem 140 via a coupling 136, back through Wye point 110 and up first conductor 108a and to sensor data module 124 for further processing. Sensor data modem 140 comprises: an analog-to-digital converter (ADC) interfaced with sensors and measurement transducers 142 for conversion of analog measurements into digital values; a digital signal processor (DSP) coupled to ADC configured for processing digital measurements obtained from ADC; and an analog front-end coupled to DSP that converts digital measurements into analog data signals communicated, via coupling 136, back through Wye point 110 and up second conductor 108b and to sensor data module 124 for further processing.

For certain embodiments, as previously mentioned, tuned impedance coupling 122 is designed to prevent the data signals (based upon frequency, for example) from passing to current sensor 116 and AC power supply. Tuned impedance coupling 122 also prevents the high voltage feeding ESP motor from entering current sensor 116 and AC power supply 114, while tuned impedance coupling 126 is designed such that the data signals are allowed to pass onto sensor data module 124. At the same time, however, tuned impedance coupling 126 also prevents AC power signals and high voltages feeding motor 19 from propagating back to sensor data module 124, as will be understood by those ordinarily skilled in the art having the benefit of this disclosure.

During the grounded state, three-phase power continues to be supplied to downhole motor 19 via cable 30 to thereby power motor 19. If, however, two of the three conductors 108a,b,c, are grounded somehow, downhole motor 19 shuts down. Nevertheless, AC power and data signals continue to transmit as long as the ungrounded conductor is 108a or 108b. If, however, conductors 108a,b are the grounded conductors, communication of AC power and data signals through Wye point 110 is prevented. Therefore, embodiments of the present disclosure take advantage of this shut down feature in the design of downhole motor to simplify the circuitry of system 100 whereby only first and second conductors 108a,b may communicate AC power and data signals. As a result, a more cost-effective power and data delivery system is provided because less power and signaling components are necessary.

When conductors 108a and 108b are both grounded, processing circuitry 138 will place switch 120 in "isolation position" (i) to isolate both conductors 108a and 108b in order to prevent any destruction of the AC power supply and data communication circuitry. In certain embodiments, it may take some time for motor 19 to shut down when two conductors are grounded. In such instances, during the transient time before motor 19 shuts down, processing circuitry 138 will place switch 120 in position (i).

As with other embodiments described herein, processing circuitry 138 may detect ground faults on first and second conductors 108a,b in a variety of ways. In certain illustrative embodiments, for example, processing circuitry 138 performs the detection and switching based upon a comparison of currents on the first and second conductors 108a,b. In other embodiments, processing circuitry 138 may determine which conductor to switch to based upon a comparison of the currents on conductors 108a,b to a preset current value. As in other embodiments, processing circuitry 138 detects the current based upon a reading of current sensor 116. High voltage switch 120 is actuated to connect to both conductors 108a,b in a sequence. Both currents are recorded and then compared, as previously described.

During normal operation of power and data delivery system 100, only one of the conductors 108a or 108b are used to communicate the AC power and data signals. In FIG. 2, second conductor 108b is being used. Initially, before a ground fault is detected, processing circuitry 138 may randomly choose a conductor 108a or 108b in which to communicate the power and data signals; alternatively, the conductor with the lowest current level may be utilized. Nevertheless, once a ground fault is detected (in this example, a fault has been detected on first conductor 108a), processing circuitry 138 sends a signal to switch 120 to switch to second conductor 108b, as shown. Thereafter, the AC power and data signals are communicated over second conductor 108b as previously described. Simultaneously, three-phase power continues to be supplied via power cable 30 to downhole motor 19. In the event that a ground fault occurs on two of the three conductors 108a,b,c, downhole motor 19 shuts down.

A frequency of the voltage signal generated by AC power supply 114 can be chosen such that it is orthogonal to one or more data communication frequencies (i.e., frequencies used for unidirectional or bi-directional data communications between downhole sensor module 112 and sensor data module 124 at the surface). Selection of mutually orthogonal frequencies reduces interference of the frequency of the voltage signal of AC power supply 114 and its harmonic components with data communication frequency/frequencies. Furthermore, the switching frequency of variable speed drive 104 that controls operation of downhole motor 19 can be selected such that that it is orthogonal to the frequency of the voltage signal of AC power supply 114 as well as to the data communication frequency/frequencies. This approach mitigates interference of the switching frequency and its harmonic components with the frequency of voltage signal of AC power supply 114 and the data communication frequency/frequencies.

In one or more embodiments, voltage, frequency and phase of AC power supply 114 can be controlled by software instructions executable by processing circuitry 138 interfaced with AC power supply 114. As will be described in more detail below, a voltage level of AC power supply 114 is ramped up (e.g., controlled by processing circuitry 138) until communication through a non-grounded conductor of power cable 30 with downhole sensor module 112 is established. This approach eliminates usage of a preset voltage for every length of power cable 30. Moreover, in certain alternative embodiments, the voltage level of AC power supply 114 at which communication with downhole sensor module 112 is established can be stored in the non-volatile memory of processing circuitry 138 for quicker/optimized restart of the system after shutdown.

The level of voltage of AC power supply 114 is further ramped up (e.g., controlled by processing circuitry 138) if communication through power cable 30 with downhole sensor module 112 is lost due to a ground fault in one of the conductors 108a,b or other system error(s). If the level of voltage of AC power supply 114 reaches a (pre-defined) threshold level and communication with downhole sensor module 112 is still not established, AC power supply 114 is switched to be connected to a non-grounded phase (e.g., switched from the first conductor 108a to the second conductor 108b as illustrated in FIG. 2 if the first conductor 108a is grounded).

If, after the ground fault, communication through power cable 30 with downhole sensor module 112 is not established even after switching AC power supply 114 to another conductor (phase) and AC power supply 114 reaches the threshold level, after a pre-defined retry procedure switch 120 is placed in position (i) and both the first and second conductors 108a,b are isolated from AC power supply 114 and sensor data module 124. In an embodiment, the pre-defined retry procedure may be based on performing auto-recovery attempts a pre-defined number of times to try to establish the communication over the first conductor 108a or the second conductor 108b. After the auto-recovery attempts failed the pre-defined number of times, switch 120 is placed in position (i) and user intervention may be requested to establish the communication over the first conductor 108a or the second conductor 108b.

For certain embodiments of the present disclosure, surface-to-downhole communication (e.g., communication between AC power supply 114 and power conversion module 134 of downhole sensor module 112) can occur through a level of voltage at downhole (e.g., a voltage level used for powering sensor data modem 140 and sensors 142). Surface-to-downhole communication can be, for example, performed by adjusting surface voltage (e.g., the voltage level of AC power supply 114 is adjusted by processing circuitry 138) so that the downhole voltage level (e.g., the voltage level used for powering sensor data modem 140 and sensors 142) equivalent to a pre-defined desired configuration is reached. In an embodiment, information about the pre-defined configuration may be fed back from the downhole sensor module 112 to processing circuitry 138 coupled to the AC power supply 114. Thus, surface-to-downhole communication (e.g., communication between AC power supply 114 and power conversion module 134 of downhole sensor module 112) can be controlled by software instructions executable by processing circuitry 138. Hence, different software based system configurations can be achieved.

For other embodiments, surface-to-downhole communication (e.g., communication between AC power supply 114 and power conversion module 134 of downhole sensor module 112) can also occur by changing a voltage frequency of AC power supply 114. The voltage frequency of AC power supply 114 can be controlled by software instructions executable by processing circuitry 138. For yet other embodiments, surface-to-downhole communication can occur by changing a phase of voltage signal generated by AC power supply 114. The phase of voltage signal generated by AC power supply 114 can be controlled by software instructions executable by processing circuitry 138.

For certain other embodiments, an energy storage device 144 (e.g., a capacitive circuitry) can be used downhole coupled with power conversion module 134 to provide boost during periods of peak power associated with downhole sensor module 112, wherein the periods of peak power are typically short. The energy storage device 144 coupled with power conversion module 134 allows for AC power supply 114 at the surface to be sized for an average power instead for a peak power. Thus, coordination between surface and downhole systems is established to transmit only the average power from AC power supply 114 at the surface to power conversion module 134 placed downhole, thereby reducing power and sizing requirements for AC power supply 114 at the surface.

Figure 3:
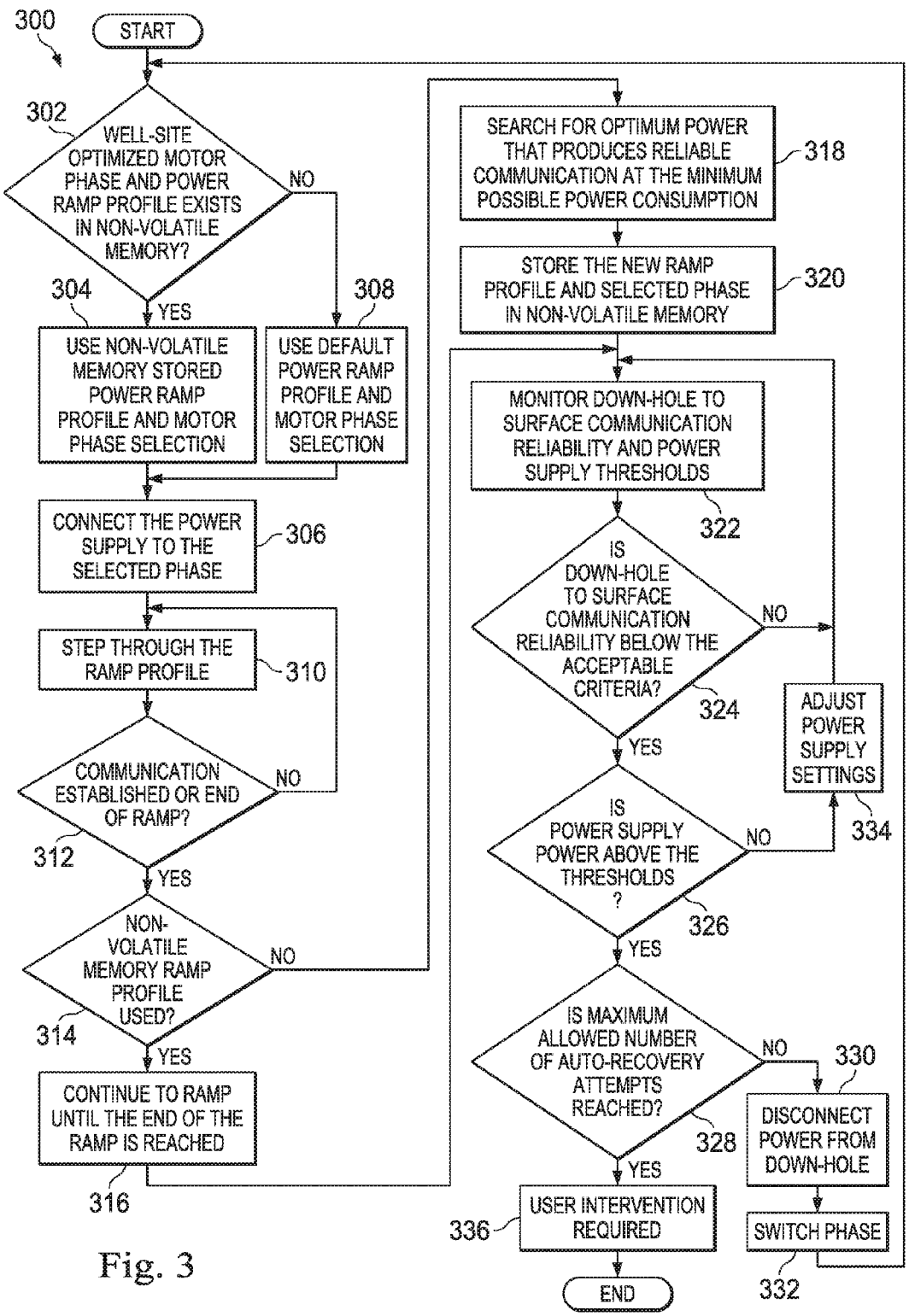
FIG. 3 is a flowchart of a workflow for adjusting power supply and switching a phase implemented in the ground fault immune power and data delivery system illustrated in FIG. 2.

FIG. 3 is a flowchart of a workflow 300 for adjusting power supply and switching a phase that can be implemented in the ground fault immune power and data delivery system illustrated in FIG. 2. For certain embodiments, the workflow 300 can be controlled by software instructions executable by processing circuitry 138 (e.g., microprocessor coupled with non-volatile memory). At a decision block 302, it can be determined whether a well-site optimized phase of downhole motor and AC power ramp profile exists in the non-volatile memory coupled with processing circuitry 138. If the profile exists in the memory, at a block 304, the stored AC power ramp profile and downhole motor phase selection can be loaded from the non-volatile memory in order to connect, at a block 306, AC power supply 114 to the selected phase. If the well-site optimized phase of downhole motor and AC power ramp profile does not exist in the non-volatile memory, default AC power ramp profile and downhole motor phase selection can be used, at a block 308.

At a block 310, AC power supply 114 can step through the AC power ramp profile (e.g., controlled by software instructions executable by processing circuitry 138) until communication between AC power supply 114 at the surface and downhole sensor module 112 is established or the end of AC power ramp is reached (e.g., determined at a decision block 312). If the AC power ramp profile from the non-volatile memory is used (e.g., determined at a decision block 314), processing circuitry 138 continues, at a block 316, to ramp up voltage of AC power supply 114 until the end of AC power ramp is reached. Otherwise, if the AC power ramp profile from the non-volatile memory is not used (e.g., determined at the decision block 314), processing circuitry 138 can search, at a block 318, for a preferred AC power that produces reliable communication between AC power supply 114 and downhole sensor module 112 at the minimum possible power consumption. At a block 320, a newly found AC power ramp profile and a selected phase associated with the minimum possible power consumption are stored in the non-volatile memory.

At a block 322, processing circuitry 138 monitors reliability of surface-to-downhole communication (e.g., communication between AC power supply 114 and power conversion module 134 of downhole sensor module 112) and AC power supply thresholds. If the reliability of surface-to-downhole communication is below the pre-defined acceptable criteria (e.g., determined at a decision block 324), if power of AC power supply 114 is above the thresholds (e.g., determined at a block 326), and if a maximum allowed number of auto-recovery attempts is not reached (e.g., determined at a block 328), then downhole sensor module 112 is disconnected, at a block 330, from AC power supply 114, and AC power supply 114 is switched to be connected to other phase, at a block 332.

For other embodiments, if the reliability of surface-to-downhole communication is below the acceptable criteria (e.g., determined at the decision block 324) and power of AC power supply 114 is not above the thresholds (e.g., determined at the block 326), processing circuitry 138 adjusts settings of AC power supply 114, at a block 334, and continues to monitor, at the block 322, reliability of surface-to-downhole communication and AC power supply thresholds. For yet other embodiments, if the reliability of surface-to-downhole communication is below the acceptable criteria (e.g., determined at the decision block 324), if power of AC power supply 114 is above the thresholds (e.g., determined at the block 326), and if the maximum allowed number of auto-recovery attempts is reached (e.g., determined at the block 328), then user intervention is required to establish the communication on either conductor 108a or 108b, at a block 336. In this case when the communication is not established over the first and second conductors 108a,b after a pre-defined retry procedure, switch 120 is placed in position (i) and both the first and second conductors 108a,b are isolated from AC power supply 114 and sensor data module 124. In an embodiment, the pre-defined retry procedure may comprise performing auto-recovery attempts a maximum allowed number of times to establish the communication over the first conductor 108a or the second conductor 108b. After the auto-recovery attempts failed the maximum allowed number of times, switch 120 is placed in position (i) and user intervention is requested, at the block 336, to try to establish the communication over the first conductor 108a or the second conductor 108b.

Figure 4:
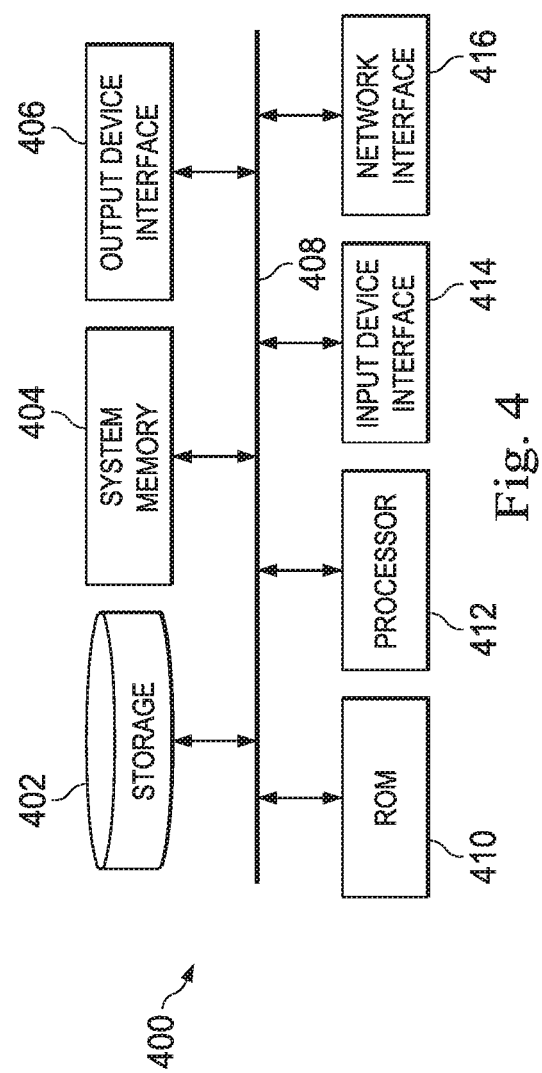
FIG. 4 is a block diagram of an illustrative computer system in which embodiments of the present disclosure may be implemented.

FIG. 4 is a block diagram of an illustrative computer system 400 in which embodiments of the present disclosure may be implemented adapted for controlling operations of the ground fault immune power and data delivery systems illustrated in FIG. 2. For example, the method of workflow 300 from FIG. 3, as described above, may be implemented using system 400. System 400 can be a computer, phone, personal digital assistant (PDA), processing system (e.g., processing circuitry 138 of the ground fault immune power and data delivery systems illustrated in FIG. 2) or any other type of electronic device. Such an electronic device includes various types of computer readable media and interfaces for various other types of computer readable media. As shown in FIG. 4, system 400 includes a permanent storage device 402, a system (non-volatile) memory 404, an output device interface 406, a system communications bus 408, a read-only memory (ROM) 410, processing unit(s) 412, an input device interface 414, and a network interface 416.

Bus 408 collectively represents all system, peripheral, and chipset buses that communicatively connect the numerous internal devices of system 400. For instance, bus 408 communicatively connects processing unit(s) 412 with ROM 410, system memory 404, and permanent storage device 402.

From these various memory units, processing unit(s) 412 retrieves instructions to execute and data to process in order to execute the processes of the subject disclosure. The processing unit(s) can be a single processor or a multi-core processor in different implementations.

ROM 410 stores static data and instructions that are needed by processing unit(s) 412 and other modules of system 400. Permanent storage device 402, on the other hand, is a read-and-write memory device. This device is a non-volatile memory unit that stores instructions and data even when system 400 is off. Some implementations of the subject disclosure use a mass-storage device (such as a magnetic or optical disk and its corresponding disk drive) as permanent storage device 402.

Other implementations use a removable storage device (such as a floppy disk, flash drive, and its corresponding disk drive) as permanent storage device 402. Like permanent storage device 402, system memory 404 is a read-and-write memory device. However, unlike storage device 402, system memory 404 is a volatile read-and-write memory, such a random access memory. System memory 404 stores some of the instructions and data that the processor needs at runtime. In some implementations, the processes of the subject disclosure are stored in system memory 404, permanent storage device 402, and/or ROM 410. For example, the various memory units include instructions for controlling operations of the of the ground fault immune power and data delivery systems illustrated in FIG. 2. From these various memory units, processing unit(s) 412 retrieves instructions to execute and data to process in order to execute the processes of some implementations.

Bus 408 also connects to input and output device interfaces 414 and 406. Input device interface 414 enables the user to communicate information and select commands to system 400. Input devices used with input device interface 414 include, for example, alphanumeric, QWERTY, or T9 keyboards, microphones, and pointing devices (also called "cursor control devices"). Output device interfaces 406 enables, for example, the display of images generated by system 400. Output devices used with output device interface 406 include, for example, printers and display devices, such as cathode ray tubes (CRT) or liquid crystal displays (LCD). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 4, bus 408 also couples system 400 to a public or private network (not shown) or combination of networks through a network interface 416. Such a network may include, for example, a local area network (LAN), such as an Intranet, or a wide area network (WAN), such as the Internet. Any or all components of system 400 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself. Accordingly, operations of the of the ground fault immune power and data delivery systems illustrated in FIG. 2 and the method of workflow 300 from FIG. 3, as described above, may be implemented using system 400 or any computer system having processing circuitry or a computer program product including instructions stored therein, which, when executed by at least one processor, causes the processor to perform functions relating to these methods.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of operations in the processes disclosed is an illustration of illustrative approaches. Based upon design preferences, it is understood that the specific order or hierarchy of operations in the processes may be rearranged, or that all illustrated operations be performed. Some of the operations may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, the illustrative methods described herein may be implemented by a system including processing circuitry or a computer program product including instructions which, when executed by at least one processor, causes the processor to perform any of the methods described herein.

A ground fault immune power and data delivery system for downhole sensors has been described and includes: a three-phase power supply connected to a power cable to thereby supply power to a downhole motor positioned along a wellbore, the power cable comprising a first, second and third conductor over which a power signal and data signals are transmitted; a downhole sensor module connected to the downhole motor; an alternating current (AC) power supply connected to only the first and second conductors to thereby supply the power signal to the downhole sensor module; and a first isolation module connected to the AC power supply to thereby selectively isolate one of the first or second conductors in response to a ground fault occurring along the first or second conductor, thereby allowing the power signal to be transmitted over only one of the first or second conductors, wherein a frequency of the power signal is orthogonal to one or more frequencies of the data signals.

For any of the foregoing embodiments, the ground fault immune power and data delivery system may include any one of the following elements, alone or in combination with each other: a computer interfaced with the AC power supply, the computer having a computer-readable storage medium having instructions stored therein, which when executed by the computer cause the computer to perform a plurality of functions, including functions to: control at least one of voltage, frequency or phase of the power signal supplied by the AC power supply, ramp up a voltage level of the AC power supply until communication with the downhole sensor module is established, store the voltage level of the AC power supply at which the communication is established in a memory of the computer, ramp up further the voltage level of the AC power supply if the communication is lost due to the ground fault or an error associated with the ground fault immune power and data delivery system, trigger the first isolation module to switch the AC power supply to a non-grounded conductor of the first or second conductors, if the voltage level of the AC power supply reaches a threshold and reliability of the communication is below a defined level, perform the communication between the AC power supply and the downhole sensor module by adjusting a voltage level of the AC power supply such that the level of voltage powering the downhole sensor module is corrected to reach a pre-defined configuration value, wherein the pre-defined configuration value is communicated from the downhole sensor module to the computer interfaced with the AC power supply, change a frequency of the power signal from the AC power supply to communicate with the downhole sensor module, and change a phase of the power signal from the AC power supply to communicate with the downhole sensor module; an energy storage device interfaced with the downhole sensor module configured to provide a power boost during peak power time associated with the downhole sensor module; the first isolation module comprises: a current sensor to detect current being supplied from the AC power supply, a switch connected to the first conductor and to the second conductor, and processing circuitry to detect the ground fault based upon a comparison of current at the first and second switches or a comparison of the current with a preset current value; a sensor data module connected to the first and second conductors to thereby bi-directionally communicate the data signals with the downhole sensor module over the first or second conductor; a second isolation module connected to the sensor data module to thereby selectively isolate one of the first or second conductors in response to the ground fault, thus allowing the data signals to be communicated over only one of the first or second conductors;

A switching frequency of a variable speed drive (VSD) coupled to the three-phase power supply and the power cable is orthogonal to the frequency of the power signal and to the one or more frequencies of the data signals; Communication between the AC power supply and the downhole sensor module over the one of the first or second conductors is based on a level of voltage powering the downhole sensor module; The downhole motor is an electrical submersible pump.

Likewise, a method for powering downhole sensors has been described and may generally include: supplying a three-phase power to a downhole motor positioned along a wellbore using a power cable comprising a first, second and third conductor; transmitting an alternating current (AC) power signal and data signals to a downhole sensor module over only the first or second conductors; detecting a ground fault on the first or second conductor; selectively isolating the first or second conductor based upon the detected ground fault, thus resulting in an isolated conductor and a connected conductor; and transmitting the AC power signal and the data signals over only the connected conductor, wherein a frequency of the AC power signal is orthogonal to one or more frequencies of the data signals, and a switching frequency of a variable speed drive connected to a three-phase power supply generating the three-phase power is orthogonal to the frequency of the power signal and to the one or more frequencies of the data signals.

For the foregoing embodiments, the method may include any one of the following operations, alone or in combination with each other: Controlling at least one of voltage, frequency or phase of the AC power signal; Ramping up a voltage level associated with the AC power signal until communication with the downhole sensor module is established; Storing the voltage level at which the communication is established; Ramping up further the voltage level if the communication is lost due to the ground fault or at least one system error; Switching transmission of the AC power signal to a non-grounded conductor of the first or second conductors, if the voltage level after the ramping up reaches a threshold and reliability of the communication is below a defined level; Isolating the first and second conductors from the AC power signal and from the data signals, if the communication is not established over the first and second conductors after a pre-defined retry procedure, wherein the pre-defined retry procedure comprises performing auto-recovery attempts a pre-defined number of times to establish the communication over the first or second conductors; Requesting a user intervention to establish the communication over the first or second conductors, if the auto-recovery attempts failed the pre-defined number of times; Communicating with the downhole sensor module over the first or second conductors based on a level of voltage powering the downhole sensor module; Communicating with the downhole sensor module comprises adjusting a voltage level associated with the AC power signal such that the level of voltage powering the downhole sensor module is corrected to reach a pre-defined configuration value; Communicating the pre-defined configuration value from the downhole sensor module to processing circuitry interfaced with a source of the AC power signal; Changing a frequency of the AC power signal to communicate with the downhole sensor module; Changing a phase of the AC power signal to communicate with the downhole sensor module; Providing a power boost during peak power time associated with the downhole sensor module; Operating a switch coupled to a source of the AC power signal and to a sensor data module processing the data signals to isolate the first or second conductor.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

Utilizing the power and data delivery systems of the present disclosure provides a number of advantages. First, instead of conventional DC power used for powering downhole sensors, AC power supply is provided herein that is operational even when one of the phases of a downhole motor is grounded. Thus, the powering scheme presented in this disclosure is ground fault immune. In contrast, conventional DC power cannot reach downhole sensor when a ground fault occurs in the system (e.g., cable/motor). Second, AC power and data components are only connected to two phases, hence less power and signaling components are needed when compared to conventional designs. Third, embodiments of the present disclosure use frequencies for AC power supply and motor drive that are orthogonal to frequencies of downhole communication signals having the least interference with each other. Fourth, embodiments of the present disclosure allow for downlink communication from a surface to a downhole controlled by software instructions executable by a processor, which can be utilized to send commands from the surface to the downhole. Fifth, the powering scheme presented herein learns characteristics of the system as it changes and saves the learned information to a non-volatile memory of the system, which can be utilized to enable fast booting times and more optimized operation. Further, the powering scheme presented herein detects a ground fault event, and changes its delivered power accordingly. When a severe ground fault is detected, the system switches to a non-grounded phase and resumes operation seamlessly. In addition, the powering system presented herein is precisely controlled by software instructions executable by processing circuitry that can control voltage, phase, and frequency of AC power supply in real time and with high resolution, which provides robustness to the system.

The foregoing disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. For example, if the apparatus in the figures is turned over, elements described as being "below" or "beneath" other elements or features would then be oriented "above" the other elements or features. Thus, the term "below" can encompass both an orientation of above and below. The apparatus may be otherwise oriented (rotated 90 degrees or at other orientations) and the spatially relative descriptors used herein may likewise be interpreted accordingly.

Although various embodiments and methods have been shown and described, the disclosure is not limited to such embodiments and methods and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A ground fault immune power and data delivery system for downhole sensors, comprising:
    a three-phase power supply connected to a power cable to thereby supply power to a downhole motor positioned along a wellbore, the power cable comprising a first, second and third conductor over which a power signal and data signals are transmitted;
    a downhole sensor module connected to the downhole motor;
    an alternating current (AC) power supply connected to only the first and second conductors to thereby supply the power signal to the downhole sensor module; and
    a first isolation module connected to the AC power supply to thereby selectively isolate one of the first or second conductors in response to a ground fault occurring along the first or second conductor, thereby allowing the power signal to be transmitted over only one of the first or second conductors,
    wherein a frequency of the power signal is orthogonal to one or more frequencies of the data signals.

2. The ground fault immune power and data delivery system as defined in claim 1, wherein a switching frequency of a variable speed drive (VSD) coupled to the three-phase power supply and the power cable is orthogonal to the frequency of the power signal and to the one or more frequencies of the data signals.

3. The ground fault immune power and data delivery system as defined in claim 1, further comprising a computer interfaced with the AC power supply, the computer having a computer-readable storage medium having instructions stored therein, which when executed by the computer cause the computer to perform a plurality of functions, including functions to:
    control at least one of voltage, frequency or phase of the power signal supplied by the AC power supply.

4. The ground fault immune power and data delivery system as defined in claim 1, further comprising a computer interfaced with the AC power supply, the computer having a computer-readable storage medium having instructions stored therein, which when executed by the computer cause the computer to perform a plurality of functions, including functions to:
    ramp up a voltage level of the AC power supply until communication with the downhole sensor module is established; and
    store the voltage level of the AC power supply at which the communication is established in a memory of the computer.

5. The ground fault immune power and data delivery system as defined in claim 4, wherein the instructions further perform functions to:
    ramp up further the voltage level of the AC power supply if the communication is lost due to the ground fault or an error associated with the ground fault immune power and data delivery system.

6. The ground fault immune power and data delivery system as defined in claim 5, wherein the instructions further perform functions to:
    trigger the first isolation module to switch the AC power supply to a non-grounded conductor of the first or second conductors, if the voltage level of the AC power supply reaches a threshold and reliability of the communication is below a defined level.

7. The ground fault immune power and data delivery system as defined in claim 1, wherein communication between the AC power supply and the downhole sensor module over the one of the first or second conductors is based on a level of voltage powering the downhole sensor module.

8. The ground fault immune power and data delivery system as defined in claim 7, further comprising a computer interfaced with the AC power supply, the computer having a computer-readable storage medium having instructions stored therein, which when executed by the computer cause the computer to perform a plurality of functions, including functions to:
    perform the communication between the AC power supply and the downhole sensor module by adjusting a voltage level of the AC power supply such that the level of voltage powering the downhole sensor module is corrected to reach a pre-defined configuration value.

9. The ground fault immune power and data delivery system as defined in claim 8, wherein the pre-defined configuration value is communicated from the downhole sensor module to the computer interfaced with the AC power supply.

10. The ground fault immune power and data delivery system as defined in claim 1, further comprising a computer interfaced with the AC power supply, the computer having a computer-readable storage medium having instructions stored therein, which when executed by the computer cause the computer to perform a plurality of functions, including functions to:

change a frequency of the power signal from the AC power supply to communicate with the downhole sensor module.

11. The ground fault immune power and data delivery system as defined in claim 1, further comprising a computer interfaced with the AC power supply, the computer having a computer-readable storage medium having instructions stored therein, which when executed by the computer cause the computer to perform a plurality of functions, including functions to:
change a phase of the power signal from the AC power supply to communicate with the downhole sensor module.

12. The ground fault immune power and data delivery system as defined in claim 1, further comprising:
an energy storage device interfaced with the downhole sensor module configured to provide a power boost during peak power time associated with the downhole sensor module.

13. The ground fault immune power and data delivery system as defined in claim 1, wherein the first isolation module comprises:
a current sensor to detect current being supplied from the AC power supply;
a switch connected to the first conductor and to the second conductor; and
processing circuitry to detect the ground fault based upon a comparison of current at the switch or a comparison of the current with a preset current value.

14. The ground fault immune power and data delivery system as defined in claim 1, further comprising:
a sensor data module connected to the first and second conductors to thereby bi-directionally communicate the data signals with the downhole sensor module over the first or second conductor; and
a second isolation module connected to the sensor data module to thereby selectively isolate one of the first or second conductors in response to the ground fault, thus allowing the data signals to be communicated over only one of the first or second conductors.

15. The ground fault immune power and data delivery system as defined in claim 1, wherein the downhole motor is an electrical submersible pump.

16. A method for powering downhole sensors, comprising:
supplying a three-phase power to a downhole motor positioned along a wellbore using a power cable comprising a first, second and third conductor;
transmitting an alternating current (AC) power signal and data signals to a downhole sensor module over only the first or second conductors;
detecting a ground fault on the first or second conductor;
selectively isolating the first or second conductor based upon the detected ground fault, thus resulting in an isolated conductor and a connected conductor; and
transmitting the AC power signal and the data signals over only the connected conductor, wherein a frequency of the AC power signal is orthogonal to one or more frequencies of the data signals.

17. The method as defined in claim 16, wherein a switching frequency of a variable speed drive coupled to a three-phase power supply generating the three-phase power is orthogonal to the frequency of the power signal and to the one or more frequencies of the data signals.

18. The method as defined in claim 16, further comprising:
controlling at least one of voltage, frequency or phase of the AC power signal.

19. The method as defined in claim 16, further comprising:
ramping up a voltage level associated with the AC power signal until communication with the downhole sensor module is established; and
storing the voltage level at which the communication is established.

20. The method as defined in claim 19, further comprising:
ramping up further the voltage level if the communication is lost due to the ground fault or at least one system error.

21. The method as defined in claim 20, further comprising:
switching transmission of the AC power signal to a non-grounded conductor of the first or second conductors, if the voltage level after the ramping up reaches a threshold and reliability of the communication is below a defined level.

22. The method as defined in claim 20, further comprising:
isolating the first and second conductors from the AC power signal and from the data signals, if the communication is not established over the first and second conductors after a pre-defined retry procedure.

23. The method as defined in claim 22, wherein the pre-defined retry procedure comprises performing auto-recovery attempts a pre-defined number of times to establish the communication over the first or second conductors.

24. The method as defined in claim 23, further comprises:
requesting a user intervention to establish the communication over the first or second conductors, if the auto-recovery attempts failed the pre-defined number of times.

25. The method as defined in claim 16, further comprising:
communicating with the downhole sensor module over the first or second conductors based on a level of voltage powering the downhole sensor module.

26. The method as defined in claim 25, wherein communicating with the downhole sensor module comprises:
adjusting a voltage level associated with the AC power signal such that the level of voltage powering the downhole sensor module is corrected to reach a pre-defined configuration value.

27. The method as defined in claim 26, further comprising:
communicating the pre-defined configuration value from the downhole sensor module to processing circuitry interfaced with a source of the AC power signal.

28. The method as defined in claim 16, further comprising:
changing a frequency of the AC power signal to communicate with the downhole sensor module.

29. The method as defined in claim 16, further comprising:
changing a phase of the AC power signal to communicate with the downhole sensor module.

30. The method as defined in claim 16, further comprising:
providing a power boost during peak power time associated with the downhole sensor module.

31. The method as defined in claim 16, further comprising:

operating a switch coupled to a source of the AC power signal and to a sensor data module processing the data signals to isolate the first or second conductor.

32. A ground fault immune power and data delivery system comprising processing circuitry to perform the method of claim 16.

* * * * *